(12) United States Patent
Huisman et al.

(10) Patent No.: US 7,434,130 B2
(45) Date of Patent: *Oct. 7, 2008

(54) USING CLOCK GATING OR SIGNAL GATING TO PARTITION A DEVICE FOR FAULT ISOLATION AND DIAGNOSTIC DATA COLLECTION

(75) Inventors: Leendert M. Huisman, South Burlington, VT (US); William V. Huott, Holmes, NY (US); Franco Motika, Hopewell Junction, NY (US); Leah M. Pfeifer Pastel, Essex, VT (US)

(73) Assignee: International Business Machines Corporation, Armonk, NY (US)

( * ) Notice: Subject to any disclaimer, the term of this patent is extended or adjusted under 35 U.S.C. 154(b) by 164 days.

This patent is subject to a terminal disclaimer.

(21) Appl. No.: 11/006,274

(22) Filed: Dec. 7, 2004

(65) Prior Publication Data

US 2005/0108599 A1    May 19, 2005

Related U.S. Application Data

(60) Continuation of application No. 10/697,365, filed on Oct. 30, 2003, now Pat. No. 6,865,501, which is a division of application No. 09/930,355, filed on Aug. 15, 2001, now Pat. No. 6,671,644.

(51) Int. Cl.
*G01R 31/28* (2006.01)
*G11C 29/00* (2006.01)

(52) U.S. Cl. .......................... 714/731; 714/710

(58) Field of Classification Search ......... 714/710–711, 714/724, 731
See application file for complete search history.

(56) References Cited

U.S. PATENT DOCUMENTS

| | | | |
|---|---|---|---|
| 4,509,008 A | 4/1985 | DasGupta et al. | |
| 4,800,564 A | 1/1989 | DeFazio et al. | |
| 5,119,378 A | 6/1992 | Welles, II et al. | |
| 5,132,974 A | 7/1992 | Rosales | |
| 6,122,756 A * | 9/2000 | Baxter et al. | 714/30 |
| 6,125,465 A | 9/2000 | McNamara et al. | |
| 6,536,024 B1 | 3/2003 | Hathaway | |
| 6,671,644 B2 * | 12/2003 | Huisman et al. | 702/117 |
| 6,865,501 B2 * | 3/2005 | Huisman et al. | 702/117 |
| 2005/0038980 A1 * | 2/2005 | Rodgers et al. | 712/220 |

OTHER PUBLICATIONS

"Resynthesis of sequential circuits for low power" by Roy et al. Circuits and Systems, 1998. ISCAS '98. Proceedings of the 1998 IEEE International Symposium on Publication Date: May 31-Jun. 3, 1998 vol. 6, On pp. 57-61 vol. 6.*

(Continued)

*Primary Examiner*—Cynthia Britt
(74) *Attorney, Agent, or Firm*—Michael J. Le Strange; Dugan & Dugan, PC

(57) ABSTRACT

In one aspect, an electronic device that has been partitioned into segments by using clock gating or signal gating is tested. One of the segments that is a source of a failure is identified. Diagnostic procedures are applied to the identified segment to determine a cause of the failure.

3 Claims, 4 Drawing Sheets

OTHER PUBLICATIONS

"Partitioning sequential circuits for low power" by Roy et al. VLSI Design, 1998. Proceedings., 1998 Eleventh International Conference on Publication Date: Jan. 4-7, 1998 On pp. 212-217.*

C.J. Richard Shi, "Block-Level Fault Isolation Using Partition Theory and logic Minimization Techniques" Mar. 1997, ECE Department, University of Iowa, Iowa City, Iowa 52242, USA.

* cited by examiner

USING CLOCK GATING OR SIGNAL GATING TO PARTITION A DEVICE FOR FAULT ISOLATION AND DIAGNOSTIC DATA COLLECTION

The present application is a continuation of and claims priority to U.S. patent application Ser. No. 10/697,365, filed Oct. 30, 2003, now U.S. Pat. No. 6,865,501 which is a division of U.S. patent application Ser. No. 09/930,355, filed Aug. 15, 2001 (now U.S. Pat. No. 6,671,644). Both of these patent applications are hereby incorporated by reference herein in their entirety.

FIELD OF THE INVENTION

This invention is related to electronic devices including computer system chips, and in particular is concerned with improved diagnosis and isolation of faults in such devices.

BACKGROUND OF THE INVENTION

An earlier related patent application discloses clock gating in the context of a computer system chip with LBIST (logic built in self test) capability. This prior application is commonly assigned with the present application, has an inventor in common herewith, and issued on Sep. 26, 2000 as U.S. Pat. No. 6,125,465, entitled "Isolation/Removal of Faults during LBIST Testing". The '465 patent is incorporated herein by reference in its entirety. The '465 patent discloses a diagnostic regime under which a clock signal is withheld from a functional unit of a chip which is known to have caused a fault. The remainder of the chip then can be tested to determine if there are further faults in the chip.

The present inventors have recognized that additional testing regimes can be employed using clock gating and/or signal gating.

SUMMARY OF THE INVENTION

According to an aspect of the invention, a method of testing an electronic device includes partitioning the device into segments by using clock gating or signal gating, and identifying one of the segments that is a source of a failure by selectively disabling at least one of the segments. The identifying of the failing segment may include enabling the segments one-by-one (with the other segments disabled) and applying a test to the enabled segment. Alternatively, the identifying of the failing segment may include disabling the segments one-by-one (with the other segments enabled) while applying a test to the device as a whole.

According to another aspect of the invention, a method of testing an electronic device includes partitioning the device into segments by using clock gating or signal gating, identifying one of the segments that is a source of a failure, and applying a diagnostic procedure to the identified segment to determine a cause of the failure. All of the segments may be logically independent of each other, or two or more of the segments may overlap each other. Numerous other aspects also are provided.

These and other improvements are set forth in the following detailed description. For a better understanding of the invention with advantages and features, refer to the description with reference to the following drawings.

DETAILED DESCRIPTION OF THE INVENTION

Figure 1:
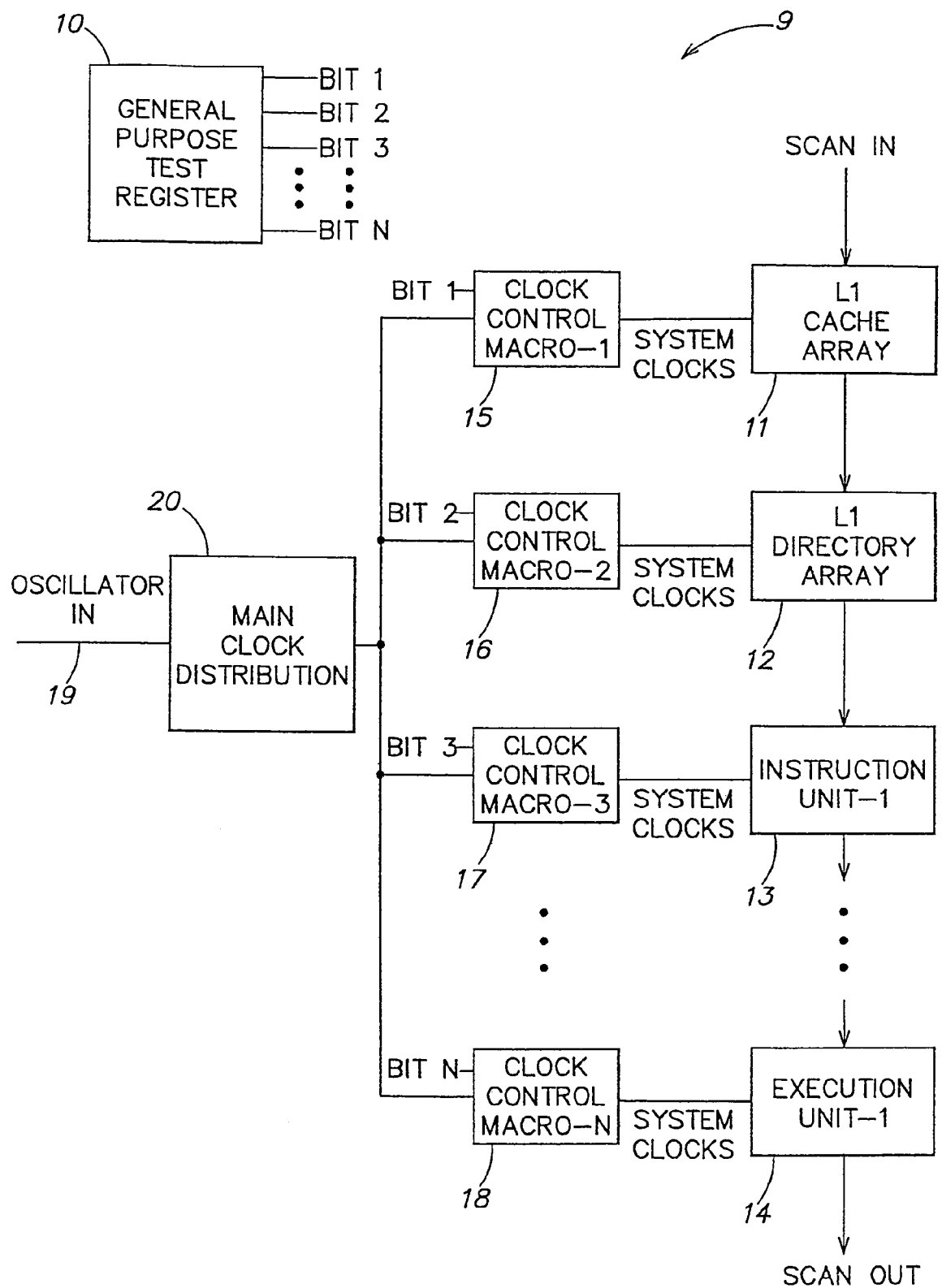
FIG. 1 is a schematic block diagram of a computer system chip in which clock gating is employed.

The present invention includes a method that uses clock gating or signal gating to partition a failing device during test. The test results can be used to localize the device's defect or defects to a segment or segments on the device. Because clock and signal gating are often related to physical placement/layout of the device, this method may be used to create physical partitions for defect localization. When a location of a failure has been refined to a particular segment, fail data collection and diagnostics can be targeted to the particular segment, thereby reducing the amount and collection time for fail data, and also reducing the data volume, complexity, and fault set needed for subsequent diagnostics.

For the present invention to be applied to a particular device, the design of the device should include appropriate clock or signal gating. Gating used may be originally included in the design, may be enhanced from the original design of the device, or may be designed in specifically for diagnostic purposes. Gating for partitioning may be added/synthesized into the design using unique algorithms to optimize diagnostic efficiency.

Segments resulting from gating, the gating to activate the segments and expected test results for each diagnostic test application should be identified. As used herein, diagnostic test application refers to applying the original test (or fail portion of the original test) under different gating conditions.

In accordance with the invention a device is tested. Devices that fail the test are identified. Clock and/or signal gating is then selectively activated to isolate specific segments of each failed device. The gating configuration (e.g., what is gated) depends on the search algorithm being used (e.g., a binary search).

After gating is selectively activated, an appropriate diagnostic test is applied to each failed device. That is, each failed device is retested using the same test which originally indicated the device failure or a portion of the test that detects the failure. Expected good test results are tailored to clock gating (as described further below). The isolation of particular segments of a failed device and application of appropriate diagnostics are repeated to create a failure signature from results of all of the diagnostic tests applied to a device. This process can be performed in various ways to determine under which gating settings the device passes and fails (and produces the failure signature). For example, all gating permutations may be run to collect pass/fail data, or a binary search algorithm may be performed to localize the failure to a specific segment. The particular failure signature produced by the failure is used to identify the failing segment. It may be necessary to provide a failure-signature-to-segment map to interpret the failure signature. Segments may also be mapped to physical entities on the chip (e.g., physical areas corresponding to the functional units).

Information regarding which segments have failed (e.g., defect localization information) can be used in a number of ways depending on the application. For example, after a failing segment has been identified, diagnostic fail data collection and software diagnostics may be targeted only to the particular segment identified as failing. As another example, after the failing segment has been identified, physical fault isolation techniques may be targeted only to the particular failing segment. As still another example, after the failing segment has been identified, partition based binning may be performed.

FIG. 1 shows a chip 9 with a basic clock distribution and control system in which the chip 9 is divided into a number (N) of functional units or segments with each unit receiving system clocks from its own clock control macro. As described below, FIG. 1 illustrates an example of clock gating.

The chip 9 includes a GPTR (general purpose test register) 10 and functional units such as L1 cache array 11, L1 directory array 12, instruction unit 13 and execution unit 14. The functional units include latches (not separately shown) connected into a scan chain (Scan In to Scan Out). The system clock for each of the functional units 11-14 is controlled independently from its own unique clock control macro, of which clock control macros 15, 16, 17 and 18 are shown, respectively connected to functional units 11, 12, 13 and 14. The clock control macros 15-18 use an oscillator input 19 to generate system clocks for the functional units, receiving the oscillator input 19 via a main clock distribution unit 20.

A GPTR bit is applied to each of the clock macros 15-18 by the GPTR 10 and is used by the respective clock control macro to stop or gate-off the system clocks fed to functional units 11-14 when the respective GPTR bit is set to a binary "one" value. Accordingly, the chip 9 may be partitioned into "segments" (e.g., L1 cache array 11, L1 cache directory 12, instruction unit 13, instruction unit 14, etc.) using clock gating (e.g., via GPTR 10 and clock control macros 15-18).

Figure 2:
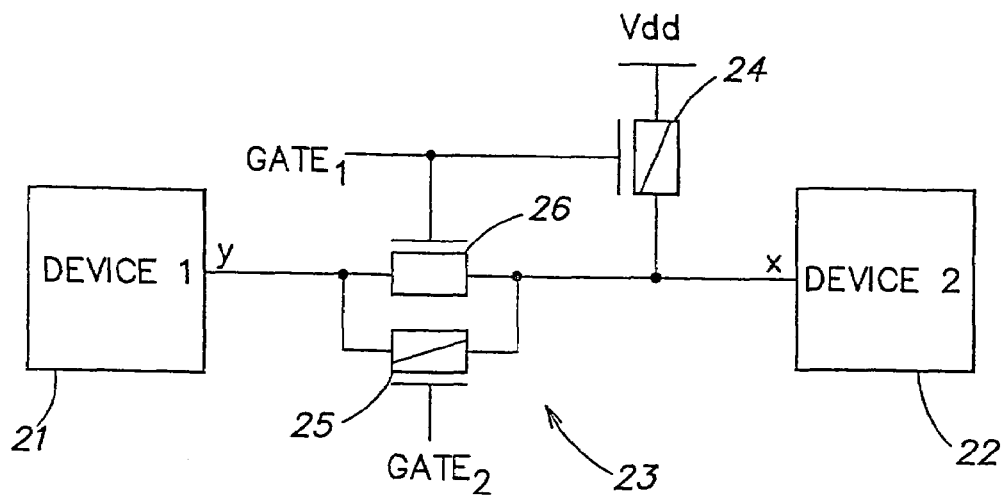
FIG. 2 is a block diagram that illustrates an example of signal gating.

FIG. 2 illustrates an example of signal gating between devices. In FIG. 2, a first device 21 is connected to a second device 22 via a gating circuit 23. The devices 21, 22 may be, for example, analog, mixed signal devices, or other devices wherein signal gating may be employed. The gating circuit 23 includes a first transistor 24 (e.g., a p-channel MOSFET), a second transistor 25 (e.g., a p-channel MOSFET) and a third transistor 26 (e.g., an n-channel MOSFET). The gating circuit 23 is in an "on" state when the gates of transistors 24 and 26 are high (e.g., $GATE_1$=binary "1") and the gate of transistor 25 is low (e.g., $GATE_2$=binary "0"). The gating circuit is in an "off" state when the gates of transistors 24 and 26 are low (e.g., $GATE_1$=0) and the gate of transistor 25 is high (e.g., $GATE_2$=1). When the gating circuit 23 is in an "on" state, the path between devices 21 and 22 is enabled, so that the input signal x for device 22 depends on the output y of device 21 and transmission characteristics of the gating circuit 23. When the gating circuit 23 is in an "off" state, the path between the devices 21 and 22 is disabled and the input x for device 22 is the Vdd signal.

Figure 3:
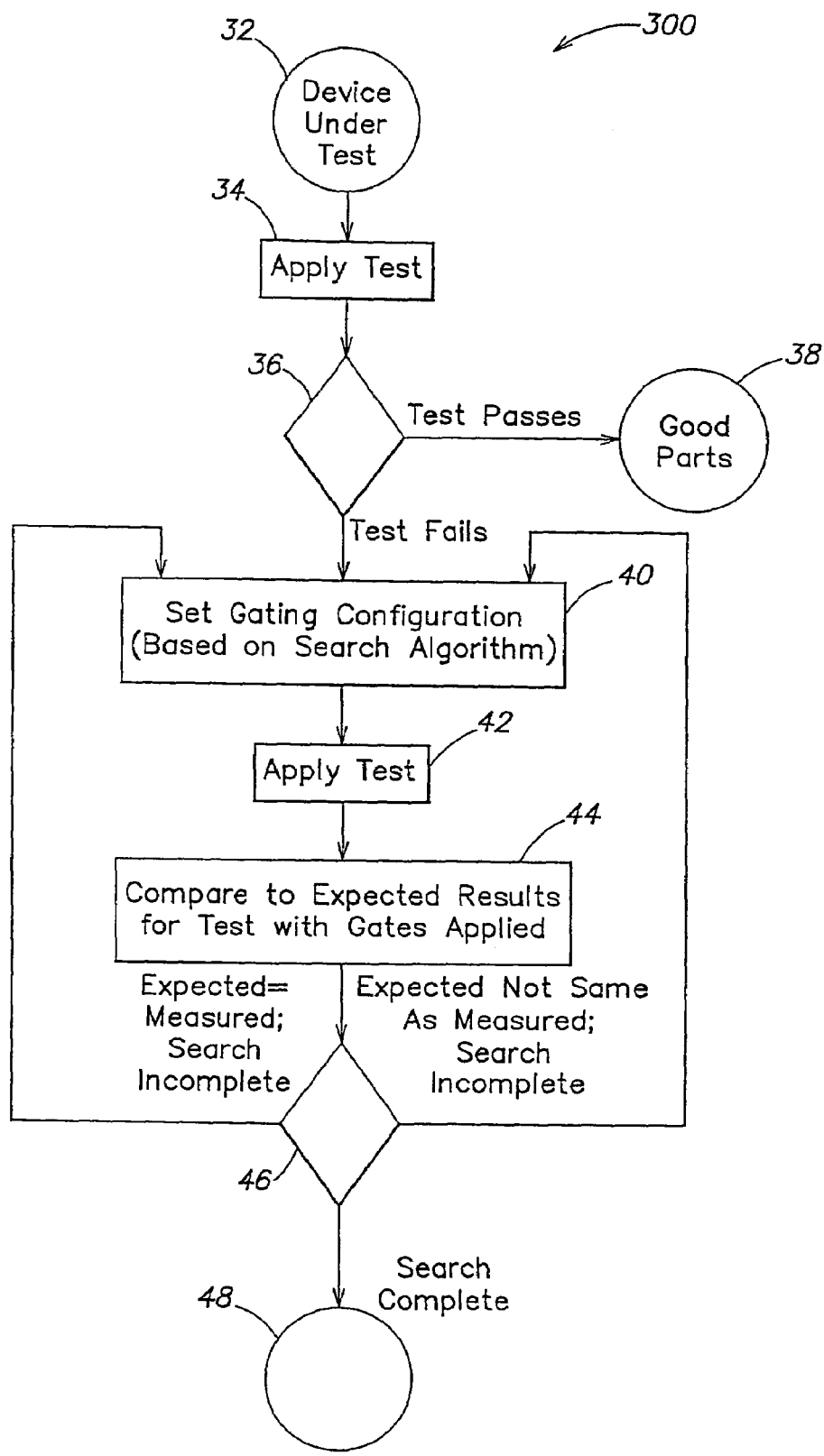
FIG. 3 is a flow chart that illustrates a procedure for localizing faults using clock gating or signal gating.

FIG. 3 is a flow chart that illustrates a process 300 by which clock gating or signal gating is applied to localize faults to particular segments or partitions of a device under test. The process 300 may be employed, for example, to the devices of FIGS. 1 and 2, or to any other devices that employ appropriate clock or signal gating. With reference to FIG. 3, at block 32 a device to be tested is provided. At block 34, a test is applied to the device (e.g., a test pattern used during conventional manufacturing tests, a test pattern specifically designed for the gating being employed, etc., as described further below). At decision block 36, it is determined whether the device under test has passed the test or failed. If the device passes, it is considered a "good" device, as indicated at 38.

If it is determined at block 36 that the device under test fails the test, then block 40 follows. At block 40, a gating configuration is set, based on a search algorithm. In one exemplary embodiment, each segment is tested individually one after another (the search algorithm) by disabling all segments except the segment under test (the gating configuration). Numerous other gating configurations may be employed as described below. The test then is applied with the gating configuration in place (block 42) and the results obtained with the gating applied are compared to the expected ("good") results (block 44). The expected results may be obtained, for example, by applying the same gating configuration and the same test to a known good part and determining the results obtained thereby (as described further below).

Following block 44 is a decision block 46 with three branches. According to a first branch, the measured results from the device under test with the gating configuration are not the same as the expected results. Accordingly, the fault is observable with the current gating configuration, and assuming the search algorithms is not complete (e.g., not all segments have been tested), and the process 300 loops back to block 40. According to a second branch from block 46, the results obtained from the device under test match the expected results but the search algorithm is incomplete. Accordingly, the fault is not observable under the current gating configuration and the process loops back to block 40 (e.g., to test further gating configurations so that the fault may be localized to a particular gated partition).

According to the third branch from block 46, the results obtained from the device under test under the current gating configuration match the expected results and the search algorithm is complete. Accordingly, the fault is localized to a gated partition (the fault is localized to the segment that failed at step 44 during the performance of the search algorithm). The process 300 ends in block 48. It is contemplated that steps 32-48 may be computer implemented.

The expected test results for a particular test and gating configuration can be obtained using one or more of the following techniques. The most appropriate technique will depend on the device design, test and fault isolation in question.

(1) Ignore or x out observation points for the gated partition, that is, ignore latch or output pin values. This approach may minimize the amount of good machine simulation needed to determine expected results.

(2) Create new expected results for the device under test for the gating configurations to be tested.

(3) Use the so-called "golden signature" approach. This is done by applying the gating configuration and test to a known good device and collecting the resulting "golden" expects from the passing test. This approach can also be used on a part that fails, if there is a set of test conditions (Vdd, temperature, timing) for which the part tests good. That is, collect the "golden" expected results when testing under passing conditions.

The present application may be applied to digital, analog, functional, manufacturing, at-speed, non-scan, scan, ABIST (array built-in self test), LBIST, and other test patterns.

For example, testing can be performed using part or all of the original test suite for a device, although using other tests not included in the original test suite is not precluded.

Patterns can be applied as they are during manufacturing tests. In some cases, it may be beneficial to use patterns that have been generated specifically to take advantage of the gated partitions. For example, when partitions overlap, a defect may reside in more than one partition. Manufacturing test patterns may activate more than one partition, adding complexity to the localization decision. If partitions do overlap, as is more likely, the pattern set can be augmented such that each fault in an overlap region is tested independently within each partition (as defined by clock gating settings) in which it resides. The augmented patterns need not be run during manufacturing tests, but should be run during diagnostic testing.

The invention is consistent with using built-in self test schemes to run test patterns and collect failure signatures on the fly, that is, using a counter to initialize gating for each test and capturing passed/failed conditions in latches after each test segment.

The invention can be used to create a partitioned ABIST during manufacturing testing. For example, when an ABIST on a large array with four sub-arrays fails, branching can be performed to rerun the ABIST with clock gating activated to determine which sub array fails. In that case, only data from the failing sub-array would need to be collected to create a bit fail map.

Test generation software could be used to create diagnostic test patterns, that is, each diagnostic test pattern could be a separate test mode generated by the test generation software. In addition, the test generation software could be enhanced to provide patterns that may be generated to take advantage of gated partitions and/or to determine which output/observation latches to ignore during diagnostic test application. Test generation software diagnostics could be performed under the specific diagnostic test mode that contains the failure, thereby reducing the CPU time and data volume associated with software diagnostics.

Defect localization to a gated partition or partitions provides useful diagnostic information in many situations. For example, the present invention may be applied to system design debug situations. When many devices fail in the same way, defect localization points to a systematic problem in design logic, circuit implementation, test pattern, test application, or process, such as a mask defect. Often, knowledge of the region of the failure and the failed signature is sufficient for designers to debug logic or circuits or test. Mask checking within a known region (smaller than the entire chip) can often be performed at a better resolution without compromising turn-around time. Thus clock gating or signal gating may be useful for providing a localization of the fault to aid in systematic design debug.

As another example, the present invention may be applied to LBIST tester-based diagnostics. LBIST failures and failures indicated by other signature based testing are often difficult to diagnose because the expected results signatures have been "compressed" (e.g., via a multiple input signature register (MISR)) and do not provide an obvious indication of what is failing. The present invention is particularly applicable to this type of problem. Using the "golden signature" approach to generate expected results avoids the costs and turn-around time associated with extensive good machine simulation.

Another example in which the invention may be applied is fault isolation for multiple defects. Often a single physical defect creates failure behavior that is modeled by multiple defect models. For example, CMP (chemical mechanical polishing) underpolish can leave a small region (e.g., ten micrometers by ten micrometers) where minimum spaced wires on a metal level are shorted together. This type of defect would be modeled by several or many stuck-at or bridging defects. The present invention can be used to diagnose a part with this kind of defect and highlight its physical location, treating it as a single defect.

The present invention can also be used to diagnose parts with multiple physical defects. The effectiveness of this application would depend on several factors, particularly on the relationships between the logic affected by each defect. If the failures can be differentiated by partition (i.e., the defects affect independent logic) or by test pattern (i.e., the defects are activated differently), then such algorithms may be tailored to better diagnose multiple defects by using this invention.

The present invention can also be used in connection with software diagnostics. When a defect location has been refined to a particular partition or partitions, software diagnostics may be used to make a diagnostic determination. By using a test targeted to the identified partition, fail data may be collected and analyzed in a more efficient manner than an untargeted test, thereby reducing the amount of fail data and time needed to collect the fail data. Targeting a region may also reduce the data volume, simulation model complexity, and fault set needed for subsequent diagnostics.

The present invention may also be used preliminarily for physical fault isolation. When a partition (identified via the present invention) corresponds to a particular physical region on the chip, physical fault isolation, including techniques such as photon emission microscopy, can make efficient use of defect localization. Another benefit of using clock gating or signal gating may be to identify a set of test patterns and set of gated configurations, that provide an effective way to activate the defect to make it observable for physical fault isolation tools, while reducing the overall circuit switching on the device.

The present invention may also be used in connection with diagnostics for manufacturing and yield improvement. The invention may be used in a manufacturing environment to automatically handle fail location, and fail data collection when necessary. Parts may be binned based on their fail signature and identified segment. Defect locations for many parts can be analyzed across manufacturing parameters to identify common fail signatures, which might be indicative of common failure mechanisms, such as circuit limited yield. The results may be used to identify the best parts for more characterization and failure analysis. The present invention provides a diagnostic method that can be implemented in a manufacturing environment without severe impacts to test time and test program operation. In a manufacturing environment, retest and data collection efficiencies are often compromised for lower manufacturing test time and test program complexity. In one embodiment, a small pattern set to support failing segment identification (called segment id patterns) is included in the manufacturing test program. The segment id patterns are applied during manufacturing test, if a device has sufficient functionality that patterns can exercise the device in a valid test. Additional data collection is limited to which segment id patterns passed/failed. The test time impact is contained by applying only a small set of additional patterns, applying them only to appropriate chips, and collecting their results. On the other hand, there is a great benefit to using the segment id pattern data collected during manufacturing test to bin the failing devices, including more efficient targeting of subsequent testing, data collection, and diagnostic resources.

The present invention is also applicable to diagnostics for analog and mixed signal devices. Clock and signal gating can be used to control which circuitry receives clock or other signals. Gating can also be used to control whether analog signals are passed from one circuit to the next. For example, AC decoupling devices can be made gateable, as shown in FIG. 2. It may be desirable to add observation points to get the full benefit of this type of gating.

The present invention is also applicable to diagnostics for 3-D structures such as chip stacks. Suitable implementation of clock gating may allow defect localization in a chip stack. For example, the defect location in a stack chip can be found by coupling traditional multi-chip module diagnostic approaches to isolate the failing chip with this invention using clock gating. The defect location would be determined by targeting diagnostics to the failing chip. Moreover, some chip stack designs, including system-on-a-chip, may naturally break into "vertical" inter-chip partitions that can be diagnosed using this invention. It would be advisable to include appropriate gating in the chip stack design. The defect location may be determined by the intersection of the diagnosed "vertical" partition and intra-chip partition.

The present invention may also be employed as part of a redundancy arrangement. Clock gating and/or signal gating may be designed into a part to determine in a self-diagnostic way whether a function with redundant backup is failing, and to activate the backup unit when necessary.

The following is an example of how the present invention may be applied in the computer system chip illustrated in FIG. 1.

Expected test results may be provided using the "golden signature" method. A known good chip is available for the test. The expected test results are LBIST signatures (values captured in latches and pin-out states as are known in the art).

LBIST testing is applied to each chip. An LBIST failure is identified that passes sufficient testing to make the LBIST test valid (probe melt, FLUSH, SCAN, others).

Clock (or signal) gating is then selectively activated to isolate each of the N functional units in turn (e.g., L1 cache array 11, L1 directory array 12, and instruction units 13, 14). The general purpose test register 10 is set to turn one functional unit off during each test pass. For each gating configuration, an LBIST test is applied to the known good chip and to the failing chip. The return signatures are unloaded and compared. This procedure is continued with each functional unit turned off in turn until the general purpose test register bit or bits needed to deactivate the failure are identified.

The general purpose test register bit or bits can be mapped to the clock control macro and the functional unit that is failing, and also to physical regions of the chip.

Following this diagnostic determination, additional test patterns targeted to the identified segment may be applied.

For example, if the failing signature was due to bad values in L1 directory array latches (element 12 in FIG. 1), then bit 2 of the general purpose test register 10 would be identified. With bit 2 set to prevent L1 directory array 12 from receiving the clock signal, the known good chip and the failing chip LBIST test signatures would match. With the bit 2 set to allow L1 directory array 12 to receive the clock signal, the two LBIST test signatures would not match. This diagnostic determination may lead to running additional patterns targeted to the circuitry in the L1 directory array 12 (e.g., generating a bit-fail map). This and other techniques may be employed to further diagnose the fault within the L1 directory array 12.

Figure 4:
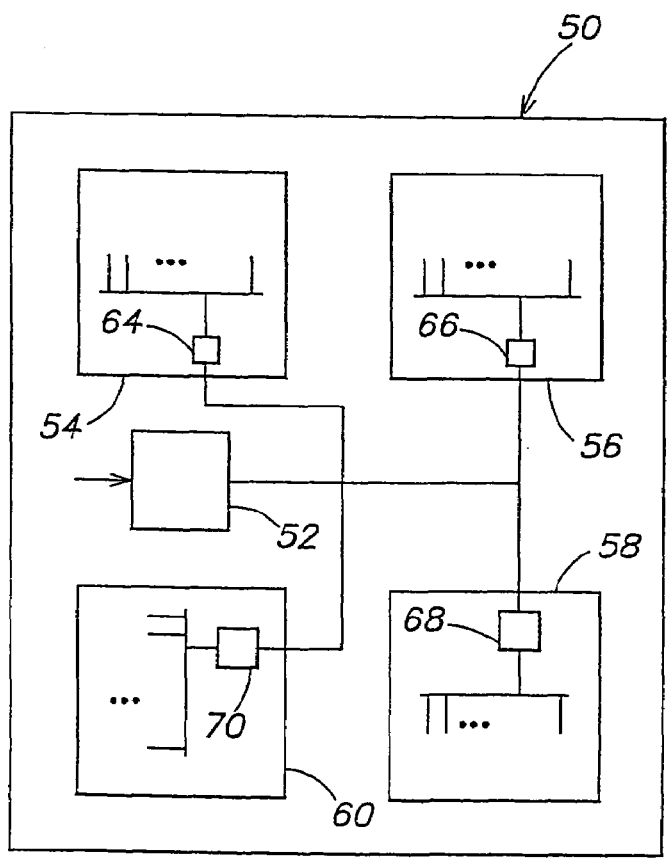
FIG. 4 is a block diagram showing another chip arrangement in which clock gating is employed.

Another example of how the present invention may be applied is illustrated in FIG. 4. In this application, the chip is divided into segments defined by the implementation of a clock or signal tree. The tree fanouts create segments that can be controlled via clock or signal gates. In the following description, the application is described for a clock tree. The invention may also be applied in the same way to a chip that includes a signal tree. The invention is also applicable to chip implementations that require multiple clock or signal trees to partition the chip.

FIG. 4 is a simplified block diagram of a computer system chip 50 provided in accordance with the invention. The chip 50 includes a clock source 52 from which a clock signal is provided to chip segments 54, 56, 58 and 60, respectively defined by clock gates 64, 66, 68 and 70. The chip segments 54-60 may be, for example, the L1 cache array 11, the L1 directory array 12, and the instruction units 13, 14 of FIG. 1, or any other suitable circuitry. The clock gates 64-70 may be, for example, the clock macros 15-18 of FIG. 1, or any other suitable clock gating mechanisms.

During manufacturing tests, the clock signal to all four segments 54-60 is active. Let it be assumed that the chip 50 fails a manufacturing test. Then, in a diagnostic mode, chip 50 is retested with all clocks active to all four segments 54-60 to verify the failure. Thereafter, the clock signal is made active in sequence one at a time to each of the segments 54-60.

Let it be assumed that the failure is present in segment 60. Then the test will provide a passing result when clock gate 64 is active, clock 66 is active and clock gate 68 is active, but the test will fail when clock 70 is active, thereby localizing the defect to segment 60. The fault isolation techniques, including diagnostic testing and data collection can then be targeted to segment 60. In other words, if a particular clock gate is enabled and the test fails, then the defect location is found to be in the chip segment which corresponds to the enabled clock gate.

As another example, if a test fails with clock gate 64 enabled and passes with clock gates 66, 68 and 70 enabled, then the defect is localized to segment 54. If the test fails with clock gate 66 enabled and passes with clock gate 64, 68 and 70 enabled, then the defect is localized to segment 56. If the test fails with clock gate 68 enabled and passes with clock gate 64, 66 and 70 enabled, then the defect is localized to segment 58. If the test fails with clock gate 70 enabled and passes with clock gates 64, 66 and 68 enabled, then the defect is localized to segment 60.

Figure 5:
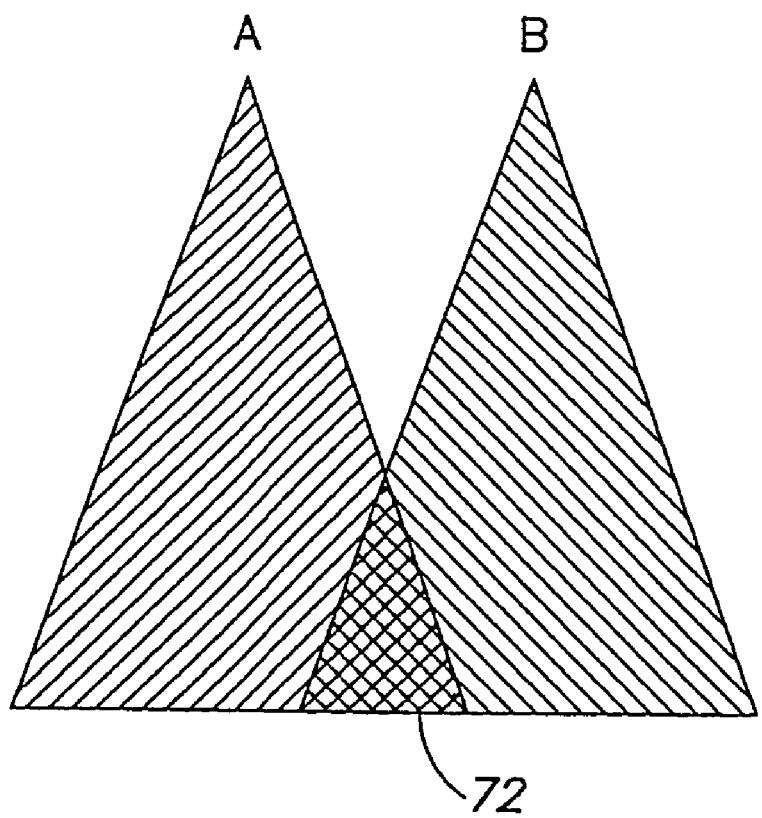
FIG. 5 schematically illustrates overlapping segments formed by partitioning using clock gating.

In the example illustrated in FIG. 4, clock gating only affects output states within a single segment. However, for more complicated systems, more than one clock gate may affect the same output states. In FIG. 5, "cones" or areas of logic overlap between segments A and B. Logic states, outputs and latch states in the common region 72 depend on clock pulses reaching logic in both segments A and B.

In operation, a test is performed with good machine expected results for all outputs, and segment A is enabled with segment B disabled. Then the test is re-run and segment A is disabled with segment B enabled. If there is a failure result in both cases, then the failure is somewhere in the union of segments A and B. If the test fails with segment A enabled and segment B disabled and passes with segment A disabled and segment B enabled, then the failure is in segment A but outside of common region 72. If the test passes with segment A enabled and segment B disabled and fails with segment A disabled and segment B enabled, then the failure is in segment B, but outside the common region 72. If the test passes with segment A enabled and segment B disabled and also with segment A disabled and segment B enabled, then the failure is outside the union of segments A and B, or the failure is within the common region 72 and requires both clock gates to be enabled to produce the failure. It may be possible to differentiate this situation by enabling the clock gates for segments A and B and disabling the rest of the segments of the chip.

The diagnostics provided in accordance with the invention can be course or fine. The granularity of the partitioning can be tailored depending on the part design and application. Fewer segments may be chosen to reduce test times for volume statistics, for a signature analysis approach to selecting parts for fine diagnostics, and to provide a coarse region for further fault isolation. A larger number of segments, especially segments that map well to physical regions of a chip, are suited for fine diagnostics to support physical failure analysis and design debug.

Efficiencies can be achieved by optimizing test generation for manufacturing tests, as well as diagnostic pattern generation, for the diagnostic method provided in accordance with this invention.

Tester based search algorithms can be used to automate the processes called for by the present invention.

An original test (e.g., a conventional manufacturing test) can be used. No special test patterns are needed.

The present invention is applicable to wafers and modules, and is useful for many types of chips, design styles and applications. The present invention may also be extended to system or higher level diagnostics.

The foregoing description discloses only the preferred embodiments of the invention, and modifications of the above disclosed methods which fall within the scope of the invention will be readily apparent to those of ordinary skill in the art. Accordingly, while the present invention has been disclosed in connection with the preferred embodiments thereof, it should be understood that other embodiments may fall within the spirit and scope of the invention as defined by the following claims.

The invention claimed is:

1. A test control device configured to:
   electrically couple to an electronic device that is configured to be partitioned into segments by using clock gating;
   partition the electronic device into the plurality of segments by using clock gating;
   control the electronic device to identify one of the segments that is a source of failure by selectively disabling at least one of the segments; and
   apply a diagnostic procedure to the electronic device partitioned into segments by clock gating to determine the cause of the failure.

2. A computer chip system comprising:
   a test control device configured to:
   electrically couple to an electronic device to be tested;
   partition the electronic device into a plurality of segments by using clock gating;
   control the electronic device to identify one of the plurality of segments that is a source of a failure by selectively disabling at least one of the plurality of segments; and
   apply a diagnostic procedure to the electronic device partitioned by clock gating to determine the cause of the failure.

3. A testing arrangement comprising:
   a test control device configured to:
   electrically couple to an electronic device that is configured to be partitioned into segments by using clock gating;
   control the electronic device to identify one of the segments that is a source of failure by selectively disabling at least one of the segments; and
   apply a diagnostic procedure to the electronic device partitioned by clock gating to determine the cause of the failure; and
   a computer configured to employ the test control device to:
   partition the electronic device into segments by using clock gating;
   identify one of the segments that is a source of a failure by selectively disabling at least one of the segments.

* * * * *